United States Patent
Fan et al.

(10) Patent No.: US 8,570,738 B2
(45) Date of Patent: Oct. 29, 2013

(54) HANDLE STRUCTURE OF ELECTRONIC DEVICE ENCLOSURE

(75) Inventors: Chen-Lu Fan, New Taipei (TW); Li-Ping Chen, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 78 days.

(21) Appl. No.: 13/276,329

(22) Filed: Oct. 19, 2011

(65) Prior Publication Data
US 2012/0170188 A1  Jul. 5, 2012

(30) Foreign Application Priority Data
Dec. 30, 2010 (TW) ................................ 99146846 A

(51) Int. Cl.
*H05K 7/00* (2006.01)
(52) U.S. Cl.
USPC ......... 361/679.59; 16/110.1; 16/445; 16/438; 361/679.01; 361/724; D8/301
(58) Field of Classification Search
USPC ......... 361/724, 726, 732, 740, 747, 754, 759, 361/679.01; 16/110.1, 445
See application file for complete search history.

(56) References Cited

U.S. PATENT DOCUMENTS

| | | | | |
|---|---|---|---|---|
| 2,715,243 A * | 8/1955 | Koll | ................................ | 16/445 |
| 2,767,424 A * | 10/1956 | Knuepfer | ........................ | 16/445 |
| 3,793,674 A * | 2/1974 | Kneier | ............................ | 16/409 |
| 3,933,269 A * | 1/1976 | Mastrovito | ..................... | 220/766 |
| 4,775,072 A * | 10/1988 | Lundblade et al. | ........... | 220/766 |
| 4,895,231 A * | 1/1990 | Yamaguchi et al. | .......... | 190/115 |
| 6,257,729 B1 * | 7/2001 | Kurosawa | ..................... | 353/119 |
| 7,516,520 B2 * | 4/2009 | Kelaher et al. | .................. | 16/445 |
| 7,541,525 B1 * | 6/2009 | Kevern | ....................... | 800/320.1 |

* cited by examiner

*Primary Examiner* — Jinhee Lee
*Assistant Examiner* — Keith Depew
(74) *Attorney, Agent, or Firm* — Altis & Wispro Law Group, Inc.

(57) ABSTRACT

An enclosure of electronic device includes a casing, a mounting member and a handle. The casing comprises a side plate and a limiting portion on the side plate. The mounting member is secured to the side plate and comprises a pivoting portion. The handle comprises an installing pole. The handle is engaged with the pivoting portion and is rotatable relative to the mounting member between a first position and a second position, and the limiting portion prevents the installing pole from disengaging from the pivoting portion, and prevents further rotation of the handle when the handle is in the second position.

18 Claims, 3 Drawing Sheets

HANDLE STRUCTURE OF ELECTRONIC DEVICE ENCLOSURE

BACKGROUND

1. Technical Field

The present disclosure relates to enclosures of electronic devices, and particularly, to an enclosure of a server computer.

2. Description of Related Art

An enclosure of an electronic device often includes a top plate, a bottom plate opposite to the top plate, and a front plate. An operating portion extends from the top plate and protrudes from the front plate for moving the electronic device. A user can use one hand on the operating portion, and the other hand on the bottom plate, to move the electronic device. However, this method is inconvenient. Therefore, there is room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
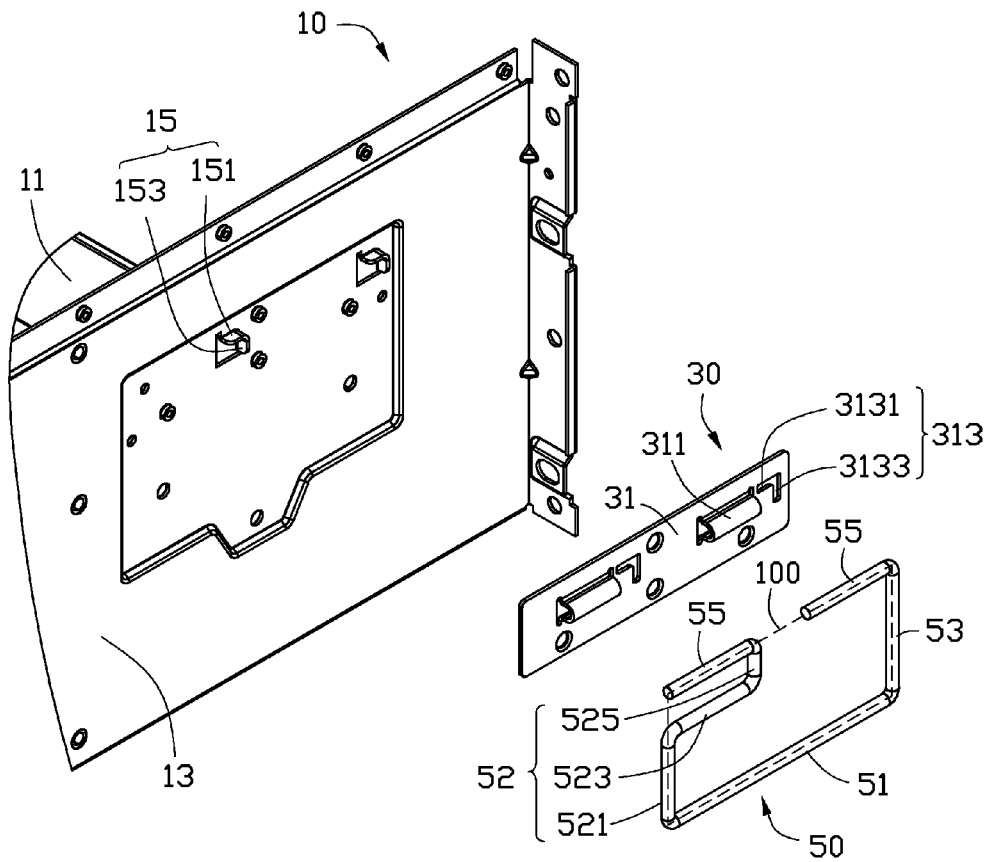
FIG. 1 is an exploded, partial, isometric view of an embodiment of an enclosure of electronic device.

Referring to FIG. 1, an enclosure of electronic device in accordance with an embodiment includes a casing 10, a mounting member 30 and a handle 50.

The casing 10 includes a bottom plate 11 and a side plate 13. In one embodiment, the bottom plate 11 is substantially perpendicular to the side plate 13. Two limiting portions 15 protrude from the side plate 13. Each limiting portion 15 includes a first limiting piece 151 and a second limiting piece 153. In one embodiment, the first limiting piece 151 is substantially perpendicular to the second limiting piece 153. The side plate 13 is substantially perpendicular to the first limiting piece 151 and the second limiting piece 153.

The mounting member 30 includes a mounting plate 31 and two pivoting portions 311 protrude from the mounting plate 31. The mounting member 30 defines two limiting slots 313. Each limiting slot 313 is on a side of each pivoting portion 311. The limiting slot 313 includes a first slot 3131 and a second slot 3133 communicated with the first slot 3131. In one embodiment, the first slot 3131 is substantially perpendicular to the second slot 3133. The mounting plate 31 further defines a plurality of mounting holes (not labeled).

The handle 50 includes a operating pole 51, a first connecting pole 52, a second connecting pole 53 and two installing poles 55. The operating pole 51 is substantially perpendicular to the second connecting pole 53. The first connecting pole 52 includes a first connecting portion 521, a bending portion 523 and a second connecting portion 525. The first connecting portion 521 is connected and substantially perpendicular to the operating pole 51. The first connecting portion 521 and the second pole 53 are in two opposite ends of the operating pole 51. The bending portion 523 is connected and substantially perpendicular to first connecting portion 521. The second connecting portion 525 is substantially perpendicular to the bending portion 523 and is substantially parallel to the second connecting pole 53. The two installing poles 55 extend along a same direction from the second connecting portion 525 and the second connecting pole 53 respectively. A distance between the second connecting portion 525 and the second connecting pole 53 is substantially equal to that between the two second limiting pieces 153. The handle 50 defines a plane 100. The operating pole 51, the first connecting pole 52, the second connecting pole 53 and the two installing poles 55 are in the plane 100.

Figure 2:
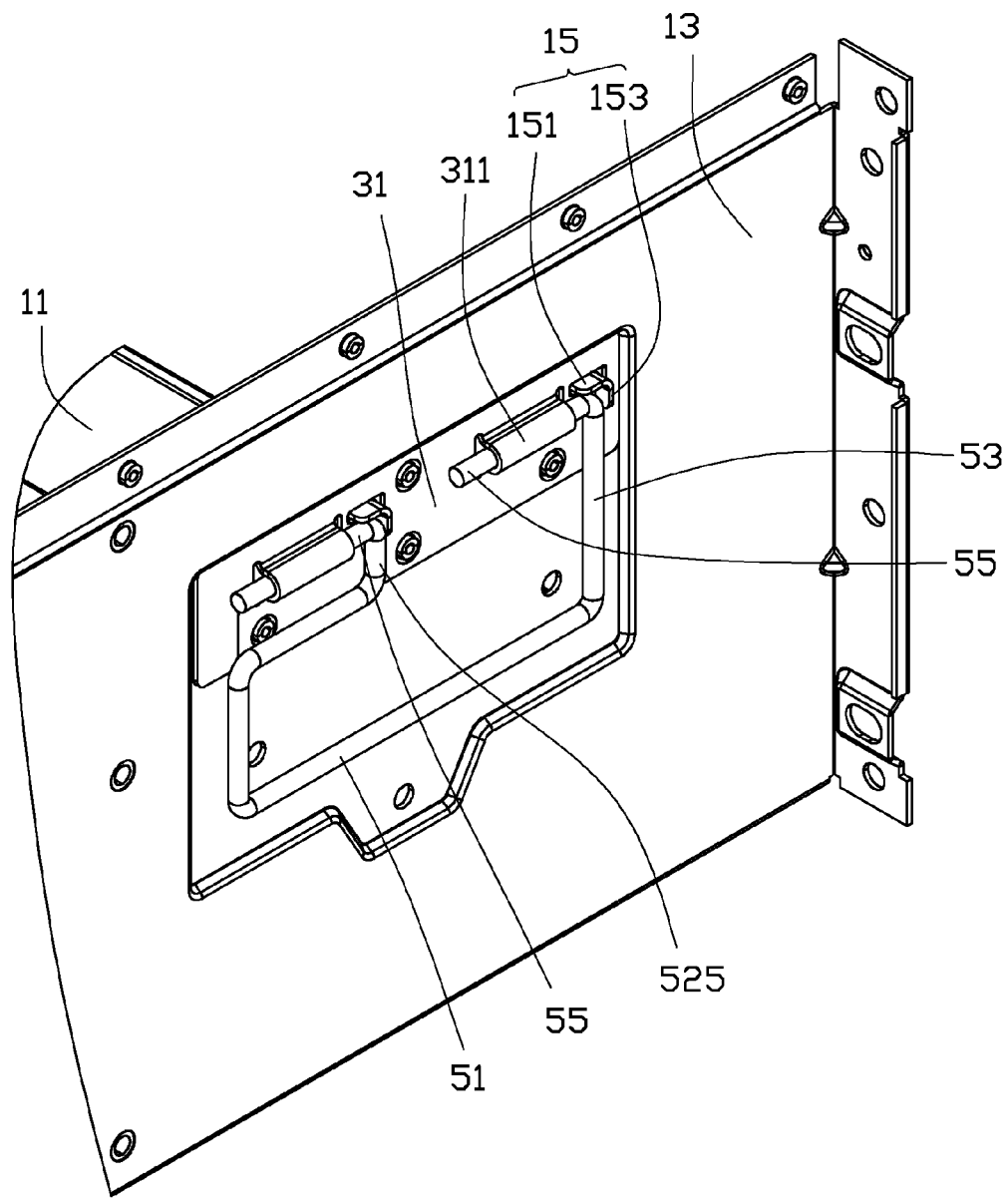
FIG. 2 is an isometric view of the assembled enclosure of electronic device of FIG. 1, and a handle is in a first position.
Figure 3:
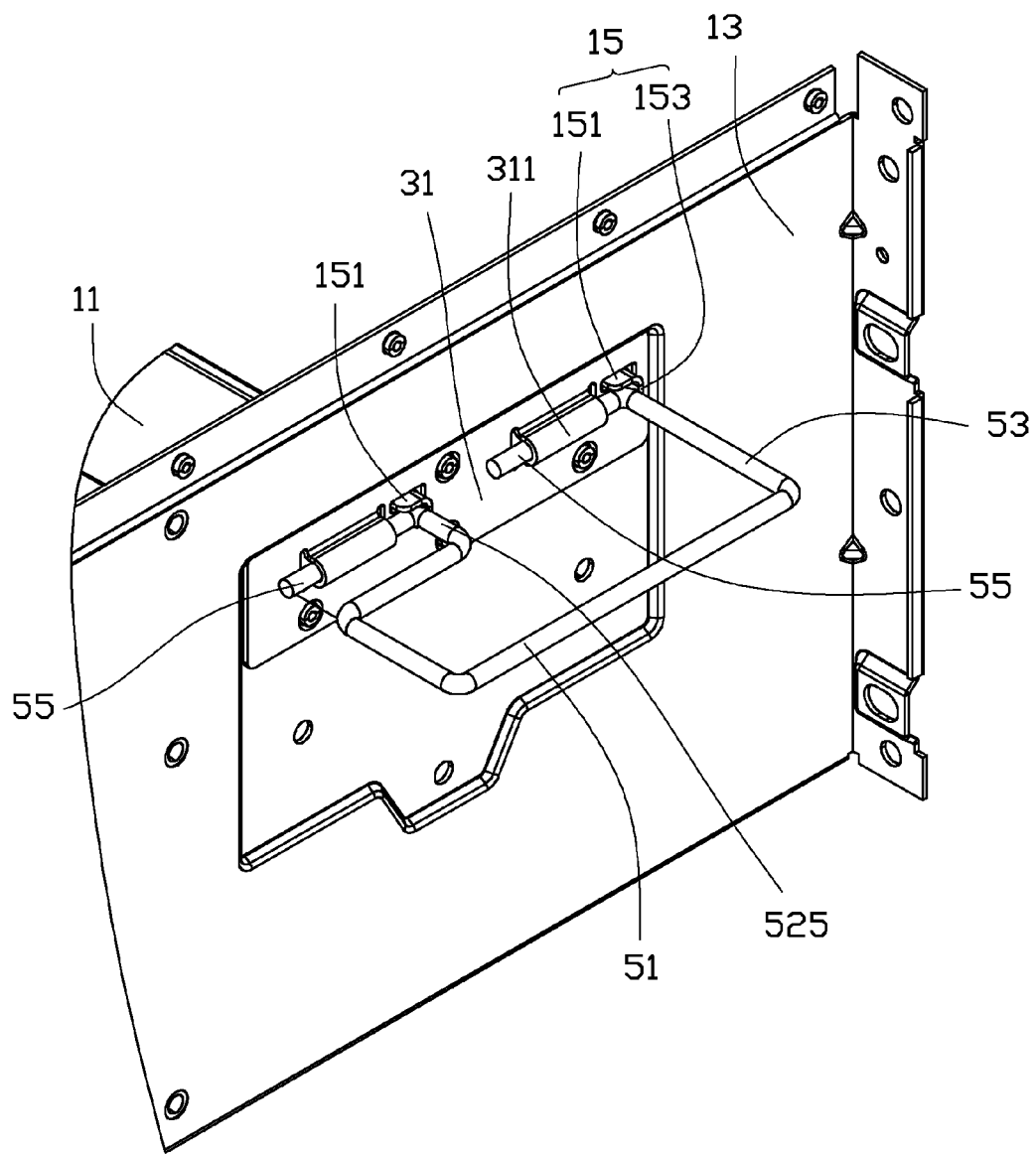
FIG. 3 is similar to FIG. 2, but the handle is in a second position.

Referring to FIGS. 2 and 3, in assembly, the handle 50 is moved to adjacent to the mounting member 30. Each installing pole 55 is inserted into the pivoting portion 311 along a first direction from the side adjacent to the limiting slot 313. The first direction is substantially parallel to the mounting member 30. A first corner between the installing pole 55 and the second connecting portion 525, and a second corner between the installing pole 55 and the second connecting pole 53 are aligned with the two limiting slots 313. The mounting member 30 is moved adjacent to the side plate 13, and the limiting slots 313 are aligned with the limiting portions 15. The mounting member 30 is moved towards the side plate 13 until the mounting member 30 is attached to the side plate 13. The two limiting portions 15 extend out of the mounting member 30 through the two limiting slots 313. The mounting member 30 is secured to the side plate 13 with the securing methods, such as screwing, soldering, and riveting. The installing pole 55 abuts against the first limiting piece 151 and is located below the first limiting piece 151. The second connecting portion 525 and the second connecting pole 53 abut the second limiting piece 153 and are located between the pivoting portion 311 and the second limiting piece 153. The second limiting piece 153 prevents the installing pole 55 from moving along the direction opposite to the first direction.

The handle 50 is capable of rotating between a first position and a second position about the pivoting portions 311. When the handle 50 is in the first position, the plane 100 the handle 50 defines is substantially parallel the side plate 13, the second limiting pieces 153 prevent the handle 50 from disengaging from the pivoting portion 311. When the handle 50 is in the second position, the plane 100 of the handle 50 is substantially perpendicular to the side plate 13, the first limiting pieces 151 prevent the handle 50 from rotating further from the second position, and the second limiting pieces 153 prevent the handle 50 from disengaging from the pivoting portions 311.

When the electronic device needs to be moved, the handle 50 is rotated to the second position, and the electronic device can be moved by pushing the handle 50.

It is to be understood, however, that even though numerous characteristics and advantages have been set forth in the foregoing description of embodiments, together with details of the structures and functions of the embodiments, the disclosure is illustrative only and changes may be made in detail, especially in the matters of shape, size, and arrangement of parts within the principles of the disclosure to the full extent indicated by the broad general meaning of the terms in which the appended claims are expressed.

What is claimed is:

1. An enclosure of electronic device, comprising:
   a casing comprising a side plate and a limiting portion located on the side plate;
   a mounting member secured to the side plate and comprising a pivoting portion; and
   a handle comprising an installing pole;
   wherein the mounting member defines a limiting slot, and the limiting portion extends out of the mounting member through the limiting slot; the handle is engaged with the pivoting portion and is rotatable relative to the mounting member between a first position and a second position, and the limiting portion prevents the installing pole from disengaging from the pivoting portion, and prevents further rotation of the handle when the handle is in the second position.

2. The enclosure of electronic device of claim 1, wherein the mounting member further comprises a mounting plate, the pivoting portion protrudes from the mounting plate, and the mounting plate is located between the side plate and the handle.

3. The enclosure of electronic device of claim 1, wherein the limiting portion comprises a first limiting piece and a second limiting piece, and the first limiting piece and the second limiting piece are substantially perpendicular to the side plate.

4. The enclosure of electronic device of claim 3, wherein the first limiting piece is substantially perpendicular to the second limiting piece.

5. The enclosure of electronic device of claim 2, wherein the limiting hole is defined in the mounting plate, and the limiting portion extends out of the mounting plate through the limiting slot.

6. The enclosure of electronic device of claim 3, wherein the limiting slot comprises a first slot corresponding to the first limiting piece and a second slot corresponding to the second limiting piece, and the first slot is communicated with the second slot.

7. The enclosure of electronic device of claim 5, wherein the limiting slot is adjacent to the pivoting portion.

8. The enclosure of electronic device of claim 3, wherein the handle further comprises a connecting pole and an operating pole, the installing pole and the operating pole extend from two opposite ends of the connecting pole, the connecting pole is substantially perpendicular to the installing pole and is located between the second limiting piece and the pivoting pole.

9. The enclosure of electronic device of claim 8, wherein the operating pole is substantially parallel to the installing pole, and the extending direction of the operating portion is the same as the installing pole.

10. The enclosure of electronic device of claim 3, wherein the handle defines a plane, when the handle is in the first position, the plane is substantially parallel to the side plate; when the handle is in the second position, the plane is substantially perpendicular to the side plate, and the first limiting piece abuts the installing pole to prevent the handle from rotating further from the second position.

11. An enclosure of electronic device, comprising:
    a casing comprising a side plate and two limiting portions located on the side plate;
    a mounting member secured to the side plate and comprising two pivoting portions; and
    a handle comprising two connecting poles opposite to each other and two installation poles;
    wherein each of the two connecting poles extends from each of the two installation poles towards a same direction; the two installation poles are engaged with the two pivoting portions and are rotatable relative to the mounting member, and the two limiting portions prevent the two installing poles from disengaging from the two pivoting portions; each of the two limiting portions comprises a first limiting piece and a second limiting piece, and the first limiting piece and the second limiting piece are substantially perpendicular to the side plate; and the mounting plate defines two limiting slots, and each of the two limiting portions extends out of the mounting plate through each of the two limiting slots.

12. The enclosure of electronic device of claim 11, wherein the mounting member further comprises a mounting plate, the two pivoting portions protrudes from the mounting plate, and the mounting plate is located between the side plate and the handle.

13. The enclosure of electronic device of claim 11, wherein the first limiting piece is substantially perpendicular to the second limiting piece.

14. The enclosure of electronic device of claim 11, wherein each limiting slot comprises a first slot corresponding to the first limiting piece and a second slot corresponding to the second limiting piece, and the first slot is communicated with the second slot.

15. The enclosure of electronic device of claim 11, wherein each limiting slot is adjacent to each of the pivoting portion.

16. The enclosure of electronic device of claim 11, wherein each connecting pole is substantially perpendicular to the installing pole and is located between the second limiting piece and the pivoting portion.

17. The enclosure of electronic device of claim 16, wherein the handle further comprises an operating pole, and the operating pole is operable to rotating the handle; each installing pole and the operating pole extend from two opposite ends of each of the connecting pole, each installing pole is substantially parallel to the operating pole and is located between the first limiting piece and the operating pole.

18. The enclosure of electronic device of claim 11, wherein the handle defines a plane, when the handle is in the first position, the plane is substantially parallel to the side plate; when the handle is in the second position, the plane is substantially perpendicular to the side plate, and the first limiting piece abuts the installing pole to prevent the handle from rotating further from the second position.

* * * * *